United States Patent [19]
Mita et al.

[11] Patent Number: 5,175,881
[45] Date of Patent: Dec. 29, 1992

[54] FM SIGNAL DETECTION APPARATUS WITH AUTOMATIC GAIN CONTROL CIRCUIT CONNECTED TO PHASE DETECTOR INPUT TERMINAL

[75] Inventors: Hiroyuki Mita; Kozo Kobayashi, both of Kanagawa, Japan

[73] Assignee: Sony Corporation, Tokyo, Japan

[21] Appl. No.: 516,783

[22] Filed: Apr. 30, 1990

[30] Foreign Application Priority Data

May 18, 1989 [JP] Japan ................................. 1-1125096

[51] Int. Cl.$^5$ ............................................. H04B 1/06
[52] U.S. Cl. .................................. 455/234.1; 455/260; 455/263; 455/266
[58] Field of Search ............... 455/232, 234, 250, 256, 455/260, 263, 264, 266, 232.1, 234.1, 250.1; 358/86

[56] References Cited

U.S. PATENT DOCUMENTS

| 3,517,268 | 6/1970 | Webb | 455/260 |
| 3,976,943 | 8/1976 | Cipher et al. | 455/234 |
| 4,472,685 | 9/1984 | Dutasta | 455/340 |
| 4,556,988 | 12/1985 | Yoshisato | 455/260 |
| 4,811,423 | 3/1989 | Eastmond | 455/235 |
| 4,907,003 | 3/1990 | Marshall et al. | 455/12 |
| 5,017,841 | 5/1991 | Miura | 453/260 |

OTHER PUBLICATIONS

Symposium Record of the 15th International T.V. Symposium, Bern, Jun. 11-17, 1987, pp. 490-502; A. H. Neelen: "An Indoor Unit for Satellite TV".
Patent Abstracts of Japan, vol. 10, No. 356 (E-459), Nov. 29, 1986; and JP-A-61 154 329 (Kokusai Denshin Denwa Co., Ltd), Jul, 14, 1986.
Patent Abstracts of Japan, vol. 8, No. 39 (E-228), Feb. 21, 1984 and JP-A-58 196 737 (Nippon Denki K.K.). Nov. 16, 1983.
Philips Telecom Review, vol. 37, No. 1, Mar. 1979, pp. 1-10, Hilversum, NL; P. Bikker et al.: "A Microprocessor-Controlled Communications Receiver".

Primary Examiner—Reinhard J. Eisenzopf
Assistant Examiner—Edward Urban
Attorney, Agent, or Firm—Philip M. Shaw, Jr.

[57] ABSTRACT

An apparatus for receiving broadcast FM waves using an FM (Frequency Modulated) detector is disclosed in which an output signal level of an automatic gain controller (AGC) is controllable so that when the C/N ratio is reduced and the output level of the automatic gain controller is reduced, the loop gain of a PLL type FM demodulator is accordingly reduced and response is delayed with the bandwidth being narrowed. Therefore, since delayed threshold extension is applied thereby, no signal noise, such as white points appearing on an image screen, will occur.

1 Claim, 3 Drawing Sheets

FM SIGNAL DETECTION APPARATUS WITH AUTOMATIC GAIN CONTROL CIRCUIT CONNECTED TO PHASE DETECTOR INPUT TERMINAL

BACKGROUND OF THE INVENTION

1. Field of the Invention

The present invention relates to an FM (Frequency modulated) detector used in e.g., a satellite broadcast receiving apparatus.

2. Background of the Art

Since FM modulation signals are used for satellite broadcasting, an FM detector is incorporated into a satellite broadcast receiver. A PLL (Phase Locked Loop) type FM demodulator is generally used for such an FM (Frequency Modulated) modulator.

In rainy weather the sensitivity and C/N (receiving Carrier to Noise) ratio of satellite antenna receiving FM modulation signals are often reduced. Under such conditions, since a threshold phenomenon occurs which becomes out of the lock-in range of the PLL, a threshold extension is applied to the FM demodulator to prevent such a threshold phenomenon from occurring.

One way to accomplish this is to vary the bandwidth of a band-pass filter which limits the cut-off frequency of a low-pass filter, e.g., a PLL loop and a bandwidth input to the FM demodulator can be used. However, it is difficult to incorporate such a circuit in an FM satellite broadcast receiver due to the complexity of the structure.

SUMMARY OF THE INVENTION

It is an object of the present invention to provide an apparatus for detecting FM satellite broadcast waves and which incorporates an FM demodulator of the PLL-type which can control a threshold extension of the FM demodulator merely by adding a simple circuit.

The above-described object can be achieved by providing an FM detector comprising:

(a) a phase detector, having two input terminals, which compares the phases of two signals applied to the two input terminals and an output terminal;

(b) a low pass filter which is connected to the output terminal of the phase detector; and (c) a voltage controlled oscillator controlled by the output of the low pass filter and connected to supply a signal to a first one of the input terminals of the phase detector, characterized by (d) a band pass filter;

(e) an AGC (Automatic Gain Control) circuit connected in series through the band pass filter to a second one of the input terminals of the phase detector; and (f) an AGC (Automatic Gain Control) controller connected to the second one of the input terminals of the phase detector and which supplies a signal to the AGC circuit for controlling the gain of the AGC circuit.

The above-described objects can also be achieved by providing a receiver of frequency modulated video signals broadcast from a satellite comprising:

(a) an input signal amplifier supplied with incoming signals and outputting an amplified corresponding signal;

(b) a microprocessor for controlling station selection operations;

(c) a local oscillator, connected to the microprocessor and controlled by it, for producing a VCO output signal;

(d) a mixer supplied with the output signal from the input signal amplifier and the VCO output signal for mixing them together and generating a corresponding output signal at an output terminal;

(e) a filter connected to the output terminal of the mixer;

(f) an IF (Intermediate Frequency) amplifier having an output terminal and being connected in series with the filter to the output terminal of the mixer;

(g) a phase detector, having two input terminals and an output terminal, which compares the phases of two signals applied to its two input terminals;

(h) a low pass filter which is connected to the output terminal of the phase detector; and (i) a voltage controlled oscillator controlled by the output of the low pass filter and connected to supply a filtered signal to a first one of the input terminals of the phase detector;

characterized by:

(j) an AGC (Automatic Gain Control) circuit connected to the output terminal of the IF amplifier;

(k) a band pass filter connected in series between the AGC circuit and a second one of the input terminals of the phase detector;

(l) an AGC (Automatic Gain Control) controller connected to the second one of the input terminals of the phase detector and which supplies a signal to the AGC circuit for controlling the gain of the AGC circuit.

The foregoing and other objectives, features and advantages of the invention will be more readily understood upon consideration of the following detailed description of certain preferred embodiments of the invention, taken in conjunction with the accompanying drawings.

DETAILED DESCRIPTION OF THE PREFERRED EMBODIMENT

Reference will hereinafter be made to the drawings in order to facilitate a better understanding of the present invention.

Figure 1:
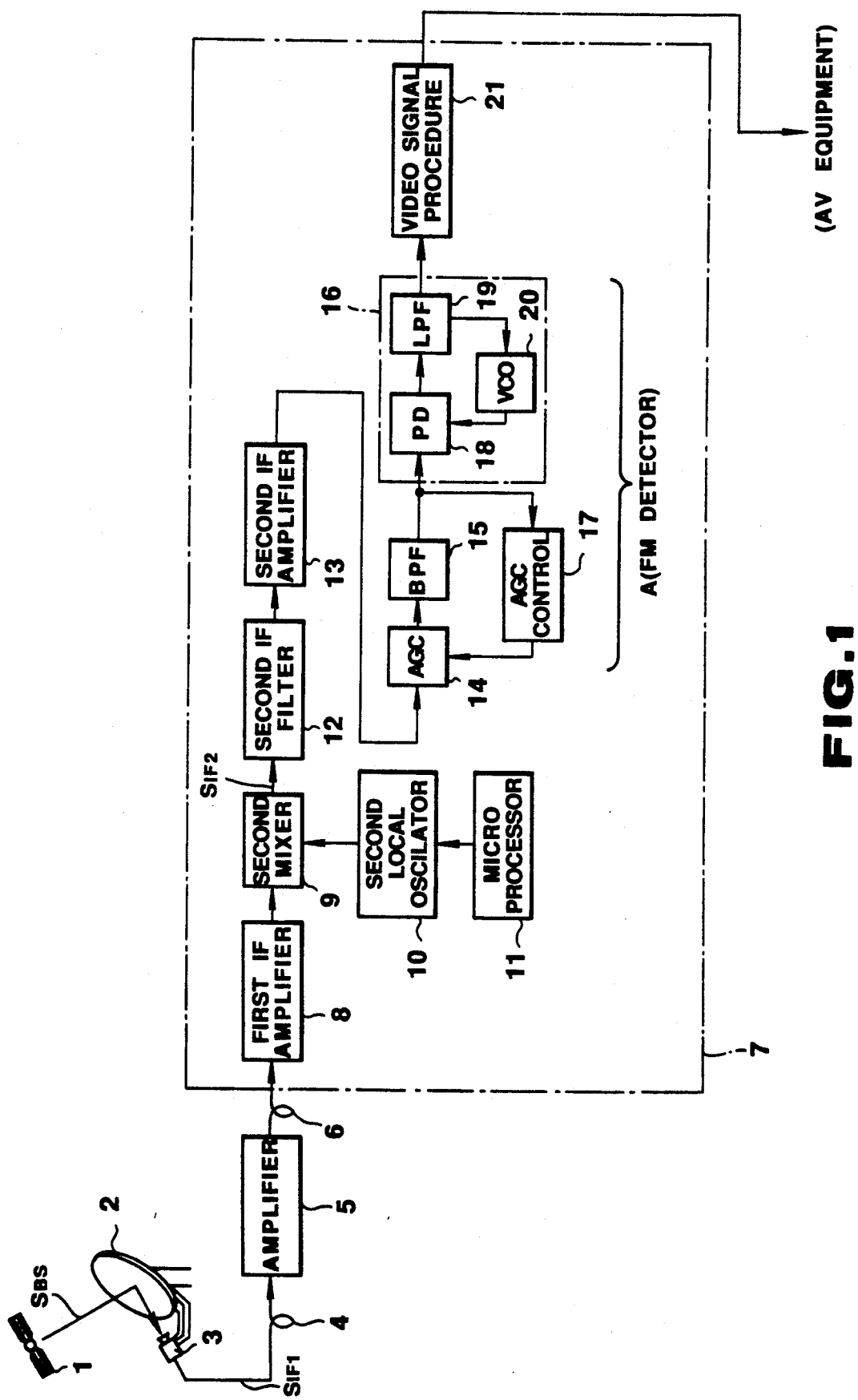
FIG. 1 is a simplified circuit block diagram of a satellite broadcast receiving apparatus using an FM detector in a preferred embodiment according to the present invention.
Figure 2:
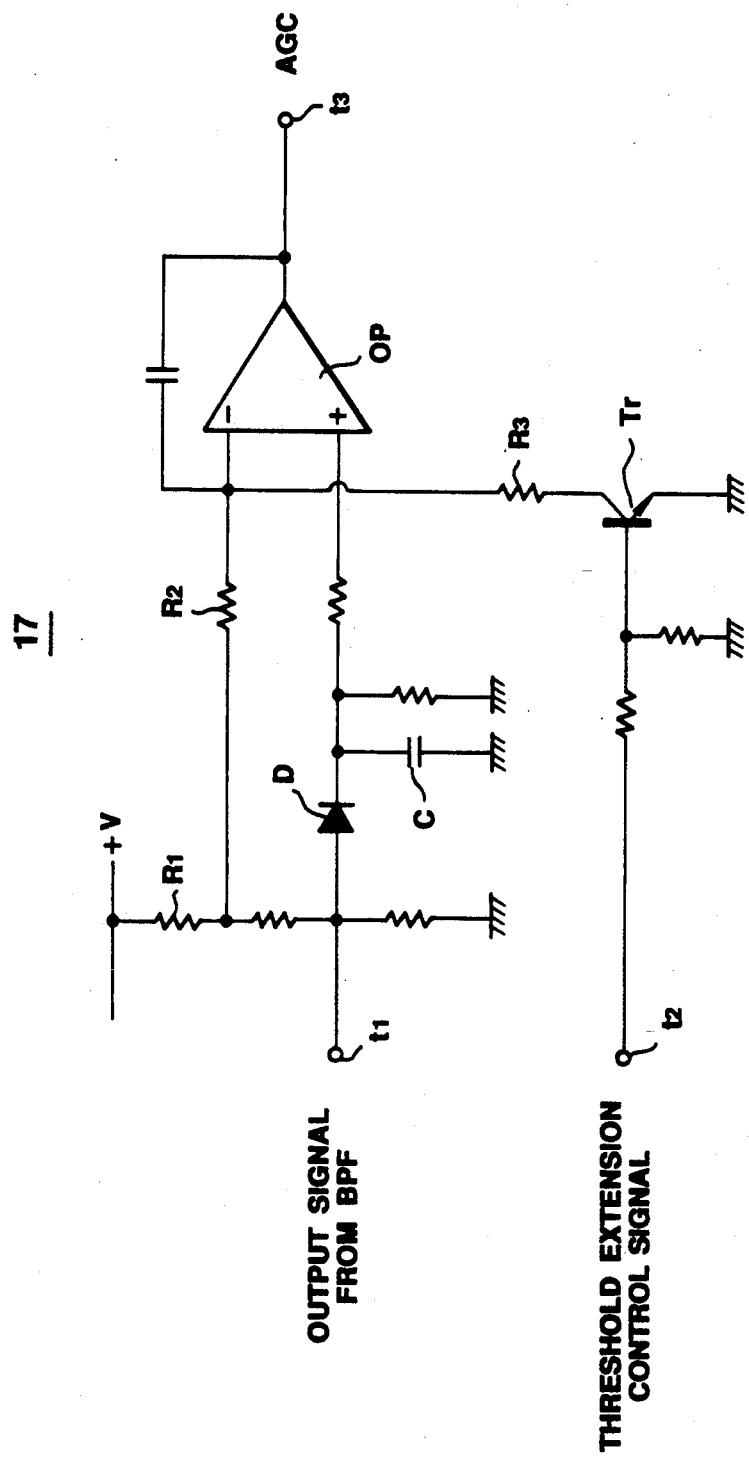
FIG. 2 is a wiring diagram of an AGC (Automatic Gain Control) circuit used in the FM detector shown in FIG. 1.

FIGS. 1 and 2 show a preferred embodiment of an FM detector applicable to a satellite broadcast receiving apparatus according to the present invention.

In FIG. 1, a broadcast signal $S_{BS}$ derived from a broadcasting satellite I is an FM (Frequency Modulated) signal. The signal $S_{BS}$ (12 GHz band) is picked up from a BS (Broadcasting Satellite) antenna 2. The signal picked up from the BS antenna 2 is frequency down converted by an S-U converter 3, thereby providing a first intermediate frequency signal $S_{IF1}$ having a frequency in the 1 GHz band. The signal $S_{IF1}$ from the S-U converter 3 is supplied through a cable 4, a booster (amplifier) 5, and a cable 6 to a B-S tuner 7 where it is further processed to output a video signal. Within the B-S tuner 7 the signal $S_{IF1}$ is supplied to a second mixer 9 via a first intermediate frequency amplifier 8. The second mixer 9 receives a local signal from a second local oscillator 10 and converts the first intermediate frequency signal $S_{IF1}$ into a second intermediate frequency signal $S_{IF2}$ of, e.g., 402.78 MHz.

The second local oscillator 10 receives a control signal from a microcomputer 11. This control signal varies the frequency of the local signal to perform selection of the received channel.

The second intermediate frequency signal $S_{IF2}$ output from the second mixer 9 is supplied through a second intermediate frequency (IF) filter 12 to a second intermediate frequency amplifier 13. The output of the amplifier 13 is supplied to an automatic gain control circuit 14 (hereinafter, referred to as an AGC circuit) of the FM detector, denoted generally by the reference A.

The FM detector A includes a series connection of an AGC circuit 14, a band pass filter (BPF) 15 which controls the band of the output of the AGC circuit 14, and a PLL type FM demodulator 16. An AGC control circuit 17 connected between the output of the band pass filter 15 and another input of the AGC circuit 14 controls the output level of the AGC circuit 14.

The AGC circuit 14 is of the reverse type. The control for the base voltage of a gain controlling transistor (not shown) causes its output signal level to be held constant with respect to variation of the input signal voltage. The frequency band of the output signal of the AGC circuit 14 is limited by means of the bandpass filter 15. Its output is supplied to an FM detector (demodulator) 16.

The FM demodulator 16 is constituted by a phase locked loop (PLL) circuit including a phase comparator 18, a low pass filter 19 (LPF) and a voltage controlled oscillator (VCO) 20. The phase comparator 18 compares the phase of the signal output from the band pass filter 15 with the phase of the signal output from the voltage controlled oscillator 20. The low pass filtered, demodulated signal is supplied to a video signal processing circuit 21, thereby demodulating the input second intermediate frequency signal $S_{IF2}$.

The PLL type FM demodulator 16 has faster response characteristics as the loop gain K becomes larger and vice versa. If the loop gain becomes small, the response becomes slower and the bandwidth of the PLL demodulator becomes narrower. The AGC controller 17 receives the output of the band pass filter 15. When the output signal of the band pass filter 15 is compared with a reference signal, the comparison result becomes an output level control signal for the AGC circuit 14. The level of the reference signal is variable. A specific example of the AGC controller 17 is hereinafter described as shown in FIG. 2.

The output signal of the band pass filter 15 is introduced into an input terminal $t_1$, in FIG. 2. The output signal is converted into a direct current by means of a diode D and a capacitor C, and the voltage is supplied to a non-inverting input terminal of an operational amplifier OP. An inverting (−) terminal of the operational amplifier OP receives a voltage +V divided by a divider network consisting of a resistor $R_1$, a resistor $R_2$, a resistor $R_3$, and a transistor $T_r$ as a reference signal. The base terminal of the transistor $T_r$ receives a threshold extension control signal from an external source via an input terminal $t_2$.

It is noted that the control signal is usually at a low (LOW) level and an operator can select the level of the control signal to be a high (HIGH) level or alternatively, automatic detection of a reduction in the C/N value can cause a change to high level.

The operational amplifier OP outputs a difference signal, comparing the levels of the reference signal and output signal of the band pass filter 15. The output signal of the operational amplifier OP is supplied to an output terminal $t_3$ which is connected to the base of the gain controlling transistor (not shown) of the AGC circuit 14.

In operation, the satellite broadcast received by the BS antenna 2 is converted into the first intermediate frequency signal $S_{IF1}$ via the S-U converter 3. The first intermediate frequency signal $S_{IF1}$ is supplied to a second mixer 9 via the amplifier 5 and the first intermediate frequency amplifier 8. The second mixer 9 converts the first intermediate frequency signal into a second intermediate frequency signal $S_{IF2}$, which is then supplied to the AGC controller 14 via the second intermediate frequency filter 12 and the second intermediate frequency amplifier 13. The second intermediate frequency signal $S_{IF2}$ supplied to the AGC controller 14 is then supplied to the FM demodulator 16 via the band pass filter 15 as a constant level signal and demodulated by the FM demodulator 16.

Suppose that the C/N value of the satellite broadcast signal is reduced. In this case the control signal of the threshold extension is changed from the low level to the high level by operator selection, the transistor $T_r$ is turned ON so that the voltage level of the reference signal applied to the inverting terminal of the OP amplifier is changed from a high level to a low level and therefore the output level of the operational amplifier Op is increased.

When the output signal of the operational amplifier OP becomes increased, the output level of the AGC controller 14 is reduced and the input signal level of the FM demodulator 16 is also accordingly reduced. The loop gain of the PLL in the FM demodulator 16 becomes reduced and its response becomes slower. Thus, the bandwidth of the PLL demodulator 16 becomes narrower. Consequently, the operation of the threshold extension is applied. When the threshold extension is applied, the trackability of the high frequency ranges becomes better and the multiplicity of white points on an image screen disappear so as to render the image screen legible.

Figure 3:
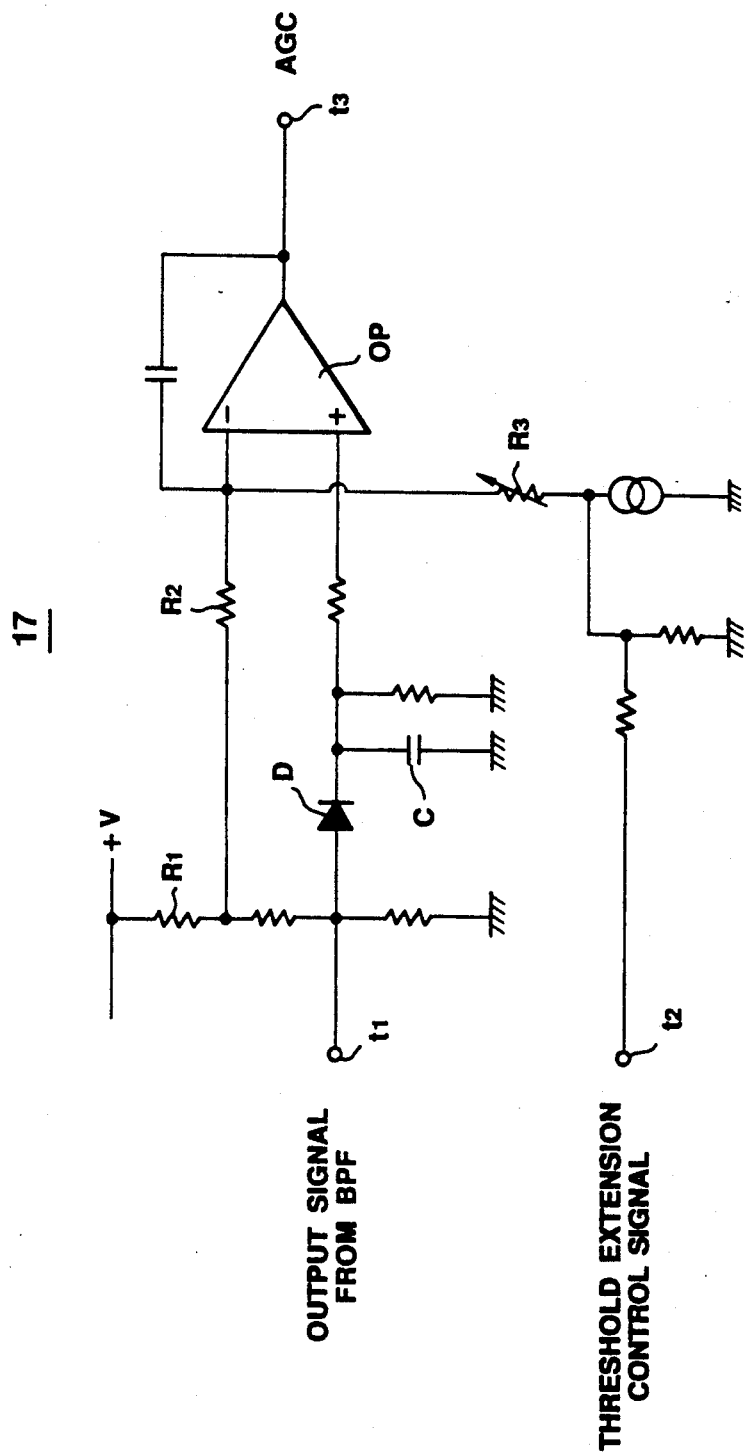
FIG. 3 is a wiring diagram of a modified AGC (Automatic Gain Control) circuit used in the FM detector shown in FIG. 1.

In the preferred embodiment, the reference signal applied to the inverting terminal of the operational amplifier OP is varied in two stages according to the turn-on state or turn-off state of the transistor $T_r$ shown in FIG. 2. If the resistor $R_3$ is a variable resistor or if a current (or voltage) source is used in place of the transistor $T_r$, as shown in FIG. 3, the reference signal level can be changed linearly. Therefore, broader or finer control can be achieved according to the C/N ratio. More efficient control of threshold extension can be carried out by the addition of a simple circuit which controls the output level of the AGC controller 17.

As described hereinabove about the linear operation of the circuit, since in the FM detecting apparatus in which the output signal of the AGC circuit 14 is input to the PLL FM demodulator 16, the output level of the AGC circuit 14 is controllable. When $R_3$ is a variable and $T_r$ is replaced by a current source, the circuit is able to operate linearly.

Suppose that the circuit works linearly, and the C/N value signal is supplied to the threshold extension control signal terminal 12 in FIG. 3, then, when the C/N value is reduced, the level at terminal 12 in FIG. 3 is reduced, the output level of the AGC circuit 14 is increased and the loop gain of the PLL circuit 16 is reduced. Then, since the response becomes delayed and the band width of the PLL circuit 16 becomes narrower, then the operation of the threshold extension is soon applied and image noise, such as white points appearing on the image screen, disappear.

It will fully be appreciated by those skilled in the art that the foregoing description has been made in terms of the preferred embodiment and various changes and modifications can be made without departing from the scope of the present invention which is to be defined by the appended claims.

What is claimed is:

1. An FM detector, comprising:
   (a) a phase detector, having two input terminals, which compares the phases of two signals applied to the two input terminals and an output terminal;
   (b) a low pass filter which is connected to the output terminal of the phase detector;
   (c) a voltage controlled oscillator controlled by the output of the low pass filter and connected to supply a signal to a first one of the input terminals of the phase detector;
   (d) a band pass filter;
   (e) an AGC (Automatic Gain Control) circuit connected in series through the band pass filter to a second one of the input terminals of the phase detector;
   (g) an AGC (Automatic Gain Control) controller connected to the second one of the input terminals of the phase detector and which supplies a signal to the AGC circuit for controlling the gain of the AGC circuit, wherein the AGC controller comprises:
   an input terminal,
   an operational amplifier having a non-inverting input and an inverting input,
   a diode connected in series with the non-inverting input and the input terminal of the AGC controller,
   a reference voltage source, and
   a controllable voltage divider network connected between the reference voltage source and the inverting input, wherein the controllable voltage divider network includes a transistor and a plurality of resistors connected between the transistor and the reference voltage source, and wherein the controllable voltage divider network supplies a controllable reference voltage to the inverting input.

* * * * *